United States Patent [19]
Canny et al.

[11] Patent Number: 5,994,876
[45] Date of Patent: Nov. 30, 1999

[54] BATTERY CAPACITY MEASUREMENT CIRCUIT

[75] Inventors: David Canny, San Jose; Gene E. Clark, Redwood City; Rupert Hsu; Rudolph J. Maske, both of San Jose, all of Calif.

[73] Assignee: Abbott Laboratories, Abbott Park, Ill.

[21] Appl. No.: 08/948,137

[22] Filed: Oct. 9, 1997

[51] Int. Cl.$^6$ .......................... H01M 10/44; H01M 10/46; H01M 10/48
[52] U.S. Cl. ..................................... 320/132; 320/DIG. 21
[58] Field of Search ....................................... 320/127, 132, 320/134, 136, 129, FOR 142, FOR 147, DIG. 19, DIG. 21; 340/635, 636; 324/427, 433

[56] References Cited

U.S. PATENT DOCUMENTS

| | | |
|---|---|---|
| 3,401,337 | 9/1968 | Beusman et al. . |
| 3,484,681 | 12/1969 | Grady, Jr. et al. . |
| 3,727,074 | 4/1973 | Keller et al. . |
| 3,778,702 | 12/1973 | Finger . |
| 3,971,980 | 7/1976 | Jungfer et al. . |
| 4,264,861 | 4/1981 | Radu et al. . |
| 4,323,849 | 4/1982 | Smith . |
| 4,678,998 | 7/1987 | Muramatsu . |
| 4,968,941 | 11/1990 | Rogers . |
| 5,179,340 | 1/1993 | Rogers . |
| 5,229,713 | 7/1993 | Bullock et al. ........................ 324/142 |
| 5,434,508 | 7/1995 | Ishida .................................. 340/636 X |
| 5,444,378 | 8/1995 | Rogers . |
| 5,451,881 | 9/1995 | Finger . |
| 5,761,072 | 6/1998 | Bardsley, Jr. et al. . |
| 5,764,034 | 6/1998 | Bowman et al. . |
| 5,789,923 | 8/1998 | Shimoyama et al. . |
| 5,793,211 | 8/1998 | Shimoyama . |
| 5,798,934 | 8/1998 | Saigo et al. . |
| 5,841,284 | 11/1998 | Takahashi . |
| 5,872,453 | 2/1999 | Shimoyama et al. . |
| 5,898,292 | 4/1999 | Takemoto et al. . |

OTHER PUBLICATIONS

Linear Technology; LT1510/LT1510–5; Constant–Voltage/Constant–Current Battery Charger; Unknown Date.
Panasonic; Sealed Lead–Acid Batteries; Technical Handbook; 1993–1994.
Benchmarq; Using the bq2010; A Tutorial for Gas Gauging; Dec., 1993.
Microchip Technology Inc.; MTA11200B; TrueGauge™Intelligent Battery Management I.C.; 1995.
Benchmarq, Using the bq2031 to Charge Lead–Acid Batteries; Oct., 1997.
Benchmarq, Switch–Mode Power Conversion Using the bq2031; Jun., 1996.
Linear Technology; Application Note 64; Using the LTC 1325 Battery Management IC, Aug., 1996.
Linear Technology; Application Note 68; LT1510 Design Manual; Dec., 1996.
Maxim Integrated Products; MAXIM Cost–Saving Multi-chemistry Battery–Charger System; MAX846A; Sep., 1996.
Unitrode Corporation; Integrated Circuits; Product & Applications Handbook 1995–96; U–104, 3–78–3–88; U–131, 3–226 –3–234; Jan., 1995.

*Primary Examiner*—Edward H. Tso
*Attorney, Agent, or Firm*—Neal D. Marcus

[57] ABSTRACT

An electronic circuit and a method for accurately measuring intermittent current pulses supplied by a storage battery to energize a load. In the preferred embodiment, an analog integrator accumulates current pulses in response to a voltage drop across a sense resistor that is connected in series between the storage battery and the load. The voltage drop is proportional to the flow of current from the battery through the load. The output of the integrator is filtered with a low pass filter to block high frequency noise, and the output of the filter is coupled to an analog to digital (A/D) converter that transforms the filtered analog signal into a corresponding digital signal. The output of the A/D converter is supplied to a port of a processor. The processor provides a signal to actuate a reset switch coupled across the integrator. When closed at the end of each integration time period, this switch zeroes the output of the analog integrator. Additionally, the processor recalibrates the circuit at predefined time intervals to determine for leakage currents for improving the accuracy with which the measurement of the flow of current from the battery is determined. In the preferred embodiment, the processor samples the output of the A/D converter every 100 milliseconds. Typically, the calibration procedure is performed every 15 minutes (while the load is energized from an AC source). This measurement circuit is part of a battery management system that preferably also includes a charge circuit for recharging the battery.

21 Claims, 3 Drawing Sheets

BATTERY CAPACITY MEASUREMENT CIRCUIT

FIELD OF THE INVENTION

The present invention generally relates to an apparatus and a method for measuring the remaining capacity of a storage battery, and more specifically, to an apparatus and a method for measuring the current drawn by a load applied to the storage battery over time to determine the power consumed by the load.

BACKGROUND OF THE INVENTION

The electrical power rating of a storage battery is defined in terms of the electrical current that can be discharged from the battery into a load over time at the rated voltage. Typically, a battery is employed to energize a device when a line electrical power source is either unavailable or the cost/space limitations of the device make the use of a line source undesirable. Since the amount of electrical power that can be stored by a storage battery is finite, it is highly desirable to provide means for accurately measuring the power discharged from a battery supplying electrical current to a device.

One of the simplest circuits for measuring current supplied by a battery to a load employs a low resistance "sense" resistor connected in series between the load and a terminal of the battery. The voltage across the sense resistor is indicative of the current flowing to the load from the storage battery. The circuit measures the magnitude of this voltage and provides a corresponding load current indication. However, this simple circuit does not measure the total amount of current from the battery over a period of time. Instead, only the instantaneous flow of current through the load is determined. Additional circuitry must be provided to determine the total power discharged from the battery. A digital processor is particularly well suited to the task of determining the total electrical power discharged from the battery and determining the remaining power stored therein. Since instantaneous current measurements are indicated by an analog signal, an analog-to-digital (A/D) conversion is required to enable a digital processor to use the signal indicative of current. An A/D converter can be used to transform the analog signal into a digital value, which is scaled to the number of digital bits provided by the A/D converter, e.g., an 8-bit A/D converter provides a digital value scaled from 0 to 255.

Another device that can be employed to perform A/D conversion is a comparator, which produces a digital bit when an analog signal at one input is equal to or greater than a reference signal at another input. Typically, the reference signal has a ramp waveform with a time period that is predetermined by the digital processor, so that the comparator produces a digital bit at the "cross over" point, e.g., when the value of the ramping reference signal is equal to or greater than the analog signal. The processor employs the time period of the "cross over" point and the time period of the ramp to determine an approximation of the total amount of current that was discharged from the battery. Since the comparator can only produce a single bit at the cross over point, the approximation is only accurate if the ramp waveform time period is at least twice as fast as the changes occurring in the measured signal. Thus, if the signal being measured is a discontinuous analog signal that switches on and off twice as fast as the ramp's time period, then the processor will fail to detect the current signal to be measured.

Until recently, devices having discontinuous current draw occurring during time intervals significantly shorter than the sampling period of a digital processor were relatively unknown. However, a substantial increase in the use of devices such as stepper motors, which intermittently draw current for time periods that are significantly shorter than the sampling rate of most digital processors, has made it difficult to accurately measure short-term discontinuous load currents. Stepper motors are often employed in battery powered consumer electronic devices, such as video camcorders and portable compact disc (CD) players. Also, the medical industry employs stepper motors to drive medical pumps that deliver specific quantities of medical substances to patients. Accordingly, it will be apparent that there is a need for a low cost approach for monitoring the current supplied to such devices over time to determine the charge remaining on storage batteries used to energize the devices.

SUMMARY OF THE INVENTION

A preferred embodiment of the invention incorporates the electronic circuit generally described above for measuring the voltage drop across a sense resistor and converting the voltage drop signal into a digitized value with an A/D converter that is coupled to a digital processor. However, the solution provided by the present invention employs an analog integration circuit for accumulating short term changes in the voltage across the sense resistor during a predetermined time interval. The integration circuit sums the plurality of short term pulses of current flowing to the load over a time interval so that all of the current flowing to the load that is coupled to a battery can be considered in determining the total electrical power discharged from a battery.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

As noted above, an object of the present invention is to provide a battery capacity measurement circuit for measuring discontinuous current pulses drawn by a load that occur intermittently for extremely brief periods of time. The time periods of the pulses are so short that it is necessary to sum (integrate) a voltage signal indicative of the magnitude of the current pulses over a fixed period of time, so that a central processing unit (CPU) can accurately determine the value of the summed signal and thus, the charge remaining in the battery.

Figure 1:
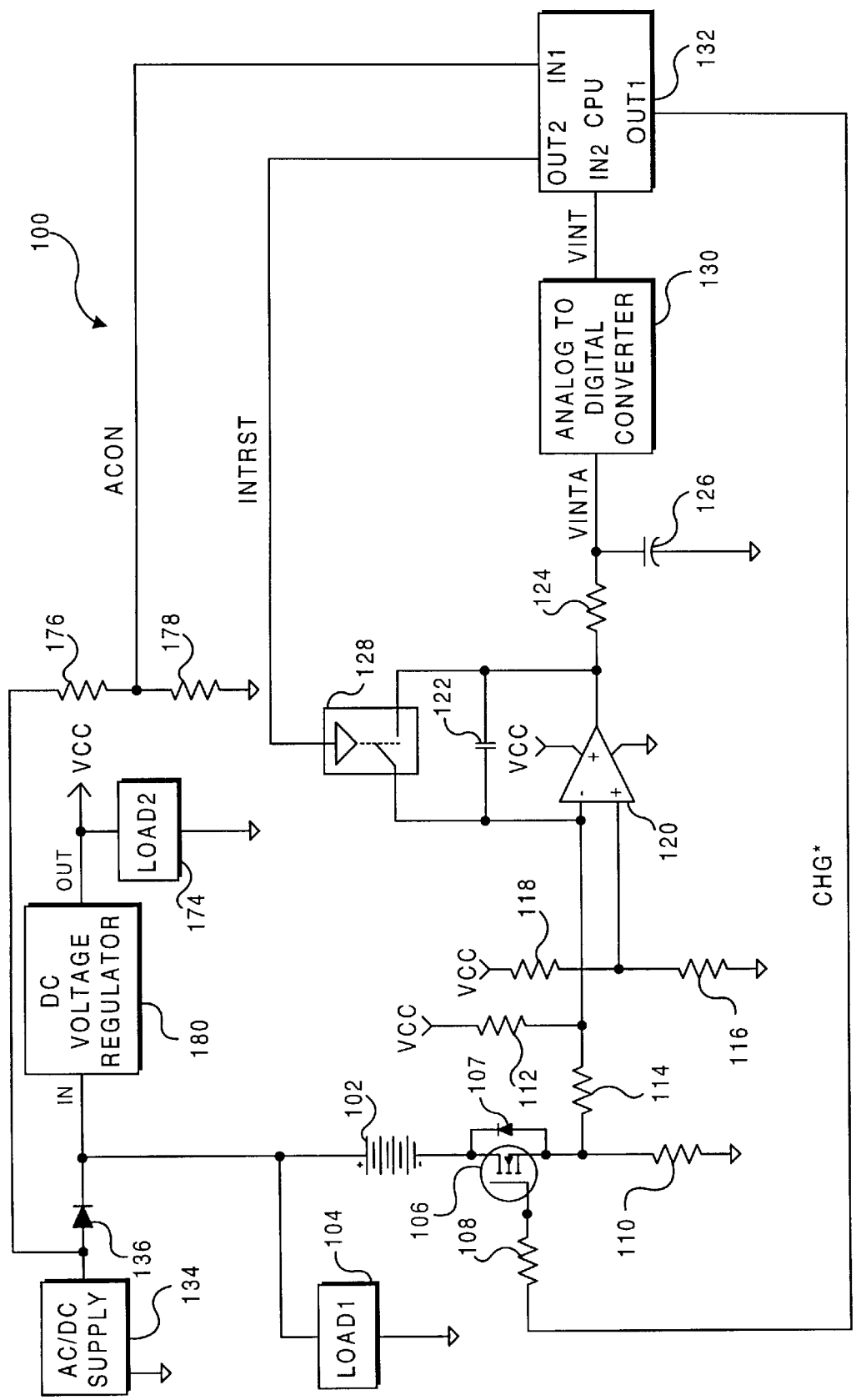
FIG. 1 is an electrical schematic diagram of a preferred embodiment of a battery management system in accord with the present invention.

A precision battery capacity measurement circuit 100, which achieves this object, is shown in FIG. 1. With reference to FIG. 1, a battery 102 has a negative terminal that is coupled to the drain terminal of an enhancement mode n-channel metal oxide semiconductor field effect transistor (MOSFET) 106. A sense resistor 110 has one end connected to the common ground of the circuit and its other end coupled to the source terminal of MOSFET 106. The gate of MOSFET 106 is coupled to one end of a resistor 108, and the other end of the resistor is coupled to the OUT1 port of a central processing unit (CPU) 132. When the CPU applies a charge (CHG) signal of about five volts from the OUT1 port to the gate of MOSFET 106 through resistor 108, the MOSFET starts to conduct and then provides a current path from its drain to its source, i.e., from the negative terminal of battery 102 to the common ground. CPU 132 is preferably a microcontroller that includes both random access memory (RAM) and read only memory (ROM). One or more programs that control the operation of CPU 132 are stored in the ROM, and the RAM stores data for processing by the CPU.

MOSFET 106 is a power semiconductor device, which has its body connected internally to the source terminal. The internal connection effectively forms a diode 107 that has an anode connected to the source terminal of MOSFET 106 and a cathode connected to the drain terminal. Further, diode 107 will conduct when the source-drain voltage is positive and greater than the diode's rated voltage drop, i.e., a return path for current is provided by the diode from the common ground to the negative terminal of battery 102 when the voltage at the negative terminal of battery 102 is substantially less than the common ground voltage. Moreover, a positive source-drain voltage occurs when battery 102 is the sole source of current to energize circuit 100 (battery mode). In the battery mode, circuit 100 measures a negative voltage drop across sense resistor 110 from the negative terminal of the battery to the common ground, so that the total amount of current drawn from the battery by a load coupled to the circuit may be determined.

An AC line source supplies an AC voltage to an AC/DC supply 134 that rectifies the AC voltage, producing a corresponding DC voltage signal. The output terminal of AC/DC supply 134 is coupled to the anode of a diode 136. The cathode of diode 136 is coupled to an input of a DC voltage regulator 180, which produces a VCC signal (+5 volts) that is supplied to specific components in circuit 100 and to other load components in the device that are not shown. Also, the cathode of diode 136 is coupled to the positive terminal of battery 102. Consequently, the voltage applied to the positive terminal of battery 102 is equal to the magnitude of the DC voltage signal rectified by AC/DC supply 134, minus the voltage drop across diode 136.

In the preferred embodiment, battery 102 is rated for six volts, and supply 134 produces a DC signal of about 7.5 volts that is reduced to a 6.8 volt signal at the positive terminal of the battery by the voltage drop across diode 136. An AC line source is employed to energize AC/DC supply 134 (line mode), so that a DC voltage is provided for recharging battery 102 and for energizing a load and circuit 100. In the line mode of operation, the common ground provided by AC/DC supply 134 is at a lower voltage than the negative terminal of battery 102 during recharging, and a current will flow from the negative terminal to the common ground so long as MOSFET 106 is conducting. Further, when operating in the line mode, circuit 100 will measure a positive voltage drop across sense resistor 110 from the negative terminal of the battery to the common ground, so that the total amount of current drawn by the battery during recharging may be determined. Additionally, when CPU 132 lowers the magnitude of the CHG signal at the OUT1 port to zero volts, MOSFET 106 stops conducting, and the current path from the negative terminal of battery 102 to the common ground of AC/DC supply 134 through sense resistor 110 is interrupted. In this manner, CPU 132 employs MOSFET 106 to stop and start the flow through sense resistor 110 of a current that is provided by AC/DC supply 134 to recharge battery 102.

The disposition of diode 136 is important to the operation of circuit 100 for at least two reasons. First, the voltage drop across the diode limits the magnitude of the voltage applied to recharge the battery. Second, when the DC signal from AC/DC supply 134 is not present, diode 136 blocks reverse current flow into the AC/DC supply from battery 102.

Additionally, a resistor 176 has one end coupled to the anode of diode 136 and its other end coupled to an IN1 port of CPU 132. A resistor 178 is connected in series with resistor 176 to the common ground, producing a voltage divider that reduces the voltage level from that provided by AC/DC supply 134. An active high ACON signal (+5 volts) is applied to the IN1 port from the common junction of resistors 176 and 178 when AC/DC supply 134 is energized, and a low (zero volts) ACON signal is applied to the IN1 port when the AC/DC supply is not energized. Based upon the level of the ACON signal, CPU 132 determines when AC/DC supply 134 is supplying the electrical current for energizing circuit 100 and the load. Moreover, since the negative terminal of battery 102 is coupled to the common ground through the parallel connection of MOSFET 106 and diode 107, the electrical components of circuit 100 cannot be reliably isolated for calibration when the circuit is being solely energized by the battery. Thus, MOSFET 106 is only switched to a non-conductive state when circuit 100 is in the line mode of operation.

A resistor 114 has one end connected to the common junction of the source terminal of MOSFET 106 and the end of resistor 110; the other end of resistor 114 is coupled to the inverting input of an operational amplifier (opamp) 120. A resistor 112 is connected between VCC (+5 volts) and the inverting input of opamp 120. In addition, a resistor 116 is connected in series with a resistor 118 between VCC and the common ground of the circuit forming another voltage divider. The common junction of resistors 116 and 118 is coupled to the non-inverting input of opamp 120. Resistors 112, 114, 116, and 118 are precision resistors having resistance values that are carefully chosen to bias the output of opamp 120 to a predetermined level greater than zero volts under the conditions described below.

Significantly, whenever battery 102 is being recharged by AC/DC supply 134, the voltage drop across sense resistor 110 from the negative terminal to the common ground is positive. This positive voltage drop across the sense resistor, when applied to the inverting input of opamp 120, would tend to produce a negative voltage at the output of opamp 120 if the non-inverting input of the opamp were referenced to the common ground. To prevent opamp 120 from having to output a negative voltage when battery 102 is being recharged, the values of the biasing resistors (112, 114, 116, and 118) are selected to ensure that the opamp's output will always be equal to or greater than zero volts for the maximum possible recharge current passing through sense resistor 110. In the preferred embodiment, the maximum recharge current through sense resistor 110 was determined to be −1.0 amps, and the biased output of opamp 120 was set at 0.7 volts for zero current flowing through the sense resistor. Thus, the biasing resistors eliminate the need to provide a negative voltage supply to opamp 120, and a negative voltage (less than zero volts) does not need to be produced by the opamp when the maximum charge current (−1.0 amp) passes through sense resistor 110 (i.e., when the AC/DC supply 134 is recharging battery 102).

A capacitor 122 is connected between the inverting input and the output of opamp 120, so that the opamp will function as an electronic integrator. Over a period of time, the electrical charge accumulated in capacitor 122 will correspond to the sum of the magnitudes of the current pulses applied to the input of the opamp, as a function of the voltage drop across sense resistor 110. The accumulated electrical charge in capacitor 122 causes a corresponding voltage at the output of the opamp, until capacitor 122 is discharged.

An electronic switch 128 is coupled in parallel with capacitor 122, and the switch is controlled by an Integrator Reset (INTRST) signal that is supplied from an OUT2 port of CPU 132. At the beginning of a periodic and predetermined time interval (100 milliseconds in the preferred embodiment), the INTRST signal is set to active high (about +5 volts) for a shorter predetermined time period (100 microseconds in the preferred embodiment). When the INTRST signal is active high, electronic switch 128 conducts, and capacitor 122 is discharged so that the output of opamp 120 is reset to a no load reference value. After the predetermined shorter time period has elapsed, the magnitude of the INTRST signal is set low (zero volts), and electronic switch 128 "opens," enabling electrical charge to begin accumulating in capacitor 122 for the remainder of the predetermined time interval (approximately 100 milliseconds).

A resistor 124 is coupled between the output of opamp 120 and the input of an A/D converter 130, and a capacitor 126 is connected between the common ground and the input of A/D converter 130. Resistor 124 and capacitor 126 thus form a single pole, low pass filter. Further, the values of resistor 124 and capacitor 126 are selected so that this filter will suppress any transient signals (noise) having a frequency greater than expected in the voltage signal produced by opamp 120. The filtered output signal (VINTA) is presented at the input to A/D converter 130 and digitized, providing a digital (VINT) signal having a scaled value. In the preferred embodiment, A/D converter 130 provides a single byte digital signal having a positive value that is scaled linearly from 0 to 255, corresponding to a filtered VINTA signal ranging from zero to +five volts. The output of A/D converter 130 is coupled to an IN2 port of CPU 132, enabling the VINT signal to be sampled at the end of the predetermined time interval and processed by a program stored within the CPU. The program implements a variety of functions that are employed in the management of battery 102, including recharging the battery, calibrating the circuitry, and measuring current flow to a load over time to determine the power remaining in the battery.

Further, circuit 100 provides for measuring current flowing through a plurality of loads having different voltage requirements. A load2 174 that is preferably energized by a conditioned five volt DC signal (VCC) is preferably coupled to the output of DC voltage regulator 180. However, a load1 104, such as a stepper motor that operates efficiently at a higher voltage/unregulated voltage, is preferably connected to the positive terminal of battery 102.

Figure 2:
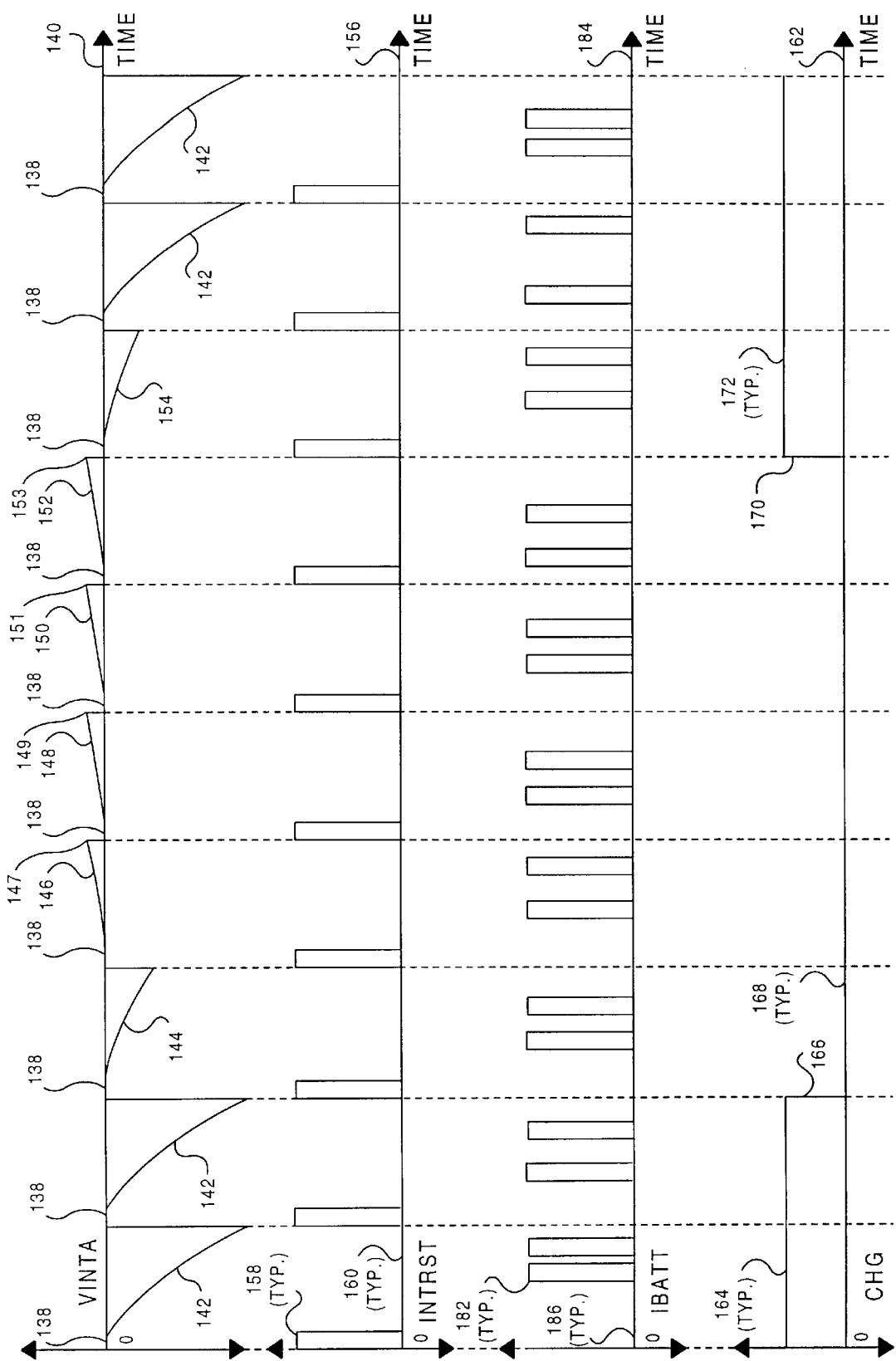
FIG. 2 is a timing diagram that illustrates the correspondence between the electrical current being measured and a pair of digital signals produced by a central processing unit (CPU) in the device energized by the battery.

Looking now to FIG. 2, a timing diagram illustrates the correspondence between four signals, VINTA, INTRST, IBATT and CHG, which are employed to calibrate circuit 100 during the line mode of operation. A calibration sequence for the output of circuit 100 is shown, extending over ten time periods that are each 100 milliseconds in duration. In the Figure, the filtered VINTA signal is illustrated relative to time, which extends along an x-axis 140. Starting at the left hand side of x-axis 140 (time=0), the VINTA signals in the first and second time periods are represented by a measurement waveform 142 that has a negative ramp shape, which decreases in magnitude from left to right.

Also, the first 100 microseconds of every time period along x-axis 140 are represented by a zero reference waveform 138, which has a magnitude proportional to the no load reference value produced by opamp 120 when electronic switch 128 is conducting.

The INTRST signal is shown relative to time, extending along an x-axis 156 from left to right. For each time period along x-axis 156, the INTRST signal includes a pulse or a step waveform 158 (logic level one high) during the first 100 microseconds and then drops to a low waveform 160 (logic level zero low) for the remainder of the period. The magnitude of the VINTA signal is cleared and set to zero reference waveform 138 when the INTRST signal is logically high, as graphically represented by step waveform 158.

CPU 132 samples the digitized value (VINT) of the magnitude of the VINTA signal at the end of each time period and before the value stored by the electronic integrator is cleared and reset to the no load reference value by the INTRST signal. Each sampled value of the VINT signal is accumulated by CPU 132 so that the program can determine the total amount of current drawn through sense resistor 110 over time, and thus the total amount of power consumed by a load. The CHG signal relative to time is illustrated along an x-axis 162 that extends from left to right, as a step waveform 164 (logic level one high), during the first and second time periods.

Discontinuous current pulses (IBATT) drawn by a load coupled to circuit 100 are represented relative to time by a series of step waveforms 182 extending along an x-axis 184. In the line mode of operation, the accumulated value of the current pulses illustrated for the first and second time periods correspond to the magnitude of the VINTA signal at the end of each time period. The magnitudes of the VINTA signals are directly proportional to the amount of current flowing from the negative terminal of battery 102 to the common ground over time, i.e., the current provided by AC/DC supply 134 to recharge battery 102. In contrast, the accumulated values of the pulses measured by circuit 100 when operating in the battery mode correspond to the magnitude of the VINTA signals, which are proportional to the current flowing from battery 102 to energize a load coupled to the circuit.

Referring back to the top graph in FIG. 2, the filtered VINTA signal becomes a settling waveform 144 that has a negative ramp shape, which decreases over time along x-axis 140. At the start of the third period in the bottom graph in this Figure, the CHG signal decreases, having a falling edge 166 that transitions from the logic level one high to a logic level zero low, as represented by a low waveform 168. The logic level of the CHG signal remains low until the end of the seventh time period. Once the CHG signal has a logic level zero low state, MOSFET 106 stops conducting, and the flow of current through sense resistor 110 is interrupted. However, MOSFET 106 does not instantaneously stop conducting and the slew rate of the MOSFET causes a delay in the interruption of the current flow through the sense resistor. The MOSFET device employed in the preferred embodiment has a slew rate that is considerably less than the predetermined time interval (100 milliseconds), so that the VINTA signal is stable by the end of the third time period. Although the value of the digitized VINTA signal (VINT) is sampled by CPU 132 at the end of the third time period and added to the accumulated value of current drawn by the load over time, the sampled value is not employed to calibrate circuit 100.

In the fourth time period, the VINTA signal is a ramp waveform 146 having a slightly increasing incline from left to right. Since the VINTA signal is now stable, CPU 132 samples the digitized magnitude of the VINTA signal at the end of the fourth period. The sampled VINTA signal corresponds to a zero current offset value 147. The sampling sequence is repeated again for the fifth, sixth, and seventh time periods, enabling CPU 132 to accumulate three more zero current offset values 149, 151, and 153 for ramp waveforms 148, 150, and 152, at the end of each respective time period.

In the preferred embodiment, the four zero current offset values accumulated by CPU 132 are used to measure the leakage current flowing through the electronic components to discharge capacitor 122. Each zero current offset value corresponds to the amount of voltage that is develops in circuit 100 due to the leakage current when the voltage drop across sense resistor 110 is approximately equal to zero volts. Furthermore, the program averages the digitized values of the zero current offset value to calibrate a new zero current offset value for the VINT signal. Averaging is employed to minimize the effect of any transients that may be present in one or more of the zero current offset values and thereby improve the accuracy with which the zero current offset value of circuit 100 is determined.

In the eighth time period, the VINTA signal is a rising waveform 154 that has a negative ramp shape, which decreases from left to right. At the beginning of the eighth time period, the CHG signal is a rising edge 170 that transitions to a step waveform 172 (logic level one high). The CHG signal remains high for the ninth and tenth time periods. When the CHG signal is logically high, MOSFET 106 starts conducting, and the current again flows through sense resistor 110. CPU 132 samples the VINT signal at the end of the eighth time period and adds the sampled value to the accumulated value of current drawn by the load.

Moving across FIG. 2 to the ninth and tenth time periods in the top graph, the negative peak VINTA signal values shown on x-axis 140 for these time periods are digitized and sampled by CPU 132. The program employs the new zero current offset value to determine the actual value of the VINT signals sampled for the ninth and tenth periods. Since the calibration sequence for determining a new zero current offset value is preferably performed every 15 minutes in the line mode, the program can automatically compensate for increases in operating temperature and/or changes in electronic component leakage currents. However, circuit 100 does not reliably measure leakage currents when the circuit is solely energized by battery 102. Consequently, the last determined "new" zero current offset value is employed by CPU 132 to measure the load current whenever circuit 100 is not in the line mode of operation.

In the battery mode of operation, circuit 100 measures the amount of current provided by battery 102 to energize a load every 100 milliseconds, and the program stored within CPU 132 employs the last determined zero current offset value to accurately determine the current for each successive time period when accumulating the total amount of current drawn by the load from battery 102 over time. The current provided by battery 102 is determined by accumulating the difference between the magnitude of the VINT signal and the zero current offset value for each predetermined time period. As discussed above, the last determined zero current offset value is employed by the program until circuit 100 is switched back to the line mode of operation and another zero current offset value is evaluated.

The functional steps necessary to implement the claimed invention have been expressed in sufficient detail in the preceding discussion to enable a person of ordinary skill in the art to write a program that follows the sequence of steps required to practice the present invention without undue experimentation. Accordingly, an enabling disclosure of the software steps in the program implemented by the present invention has been disclosed, and a detailed listing or flow chart of the program is not required.

Figure 3:
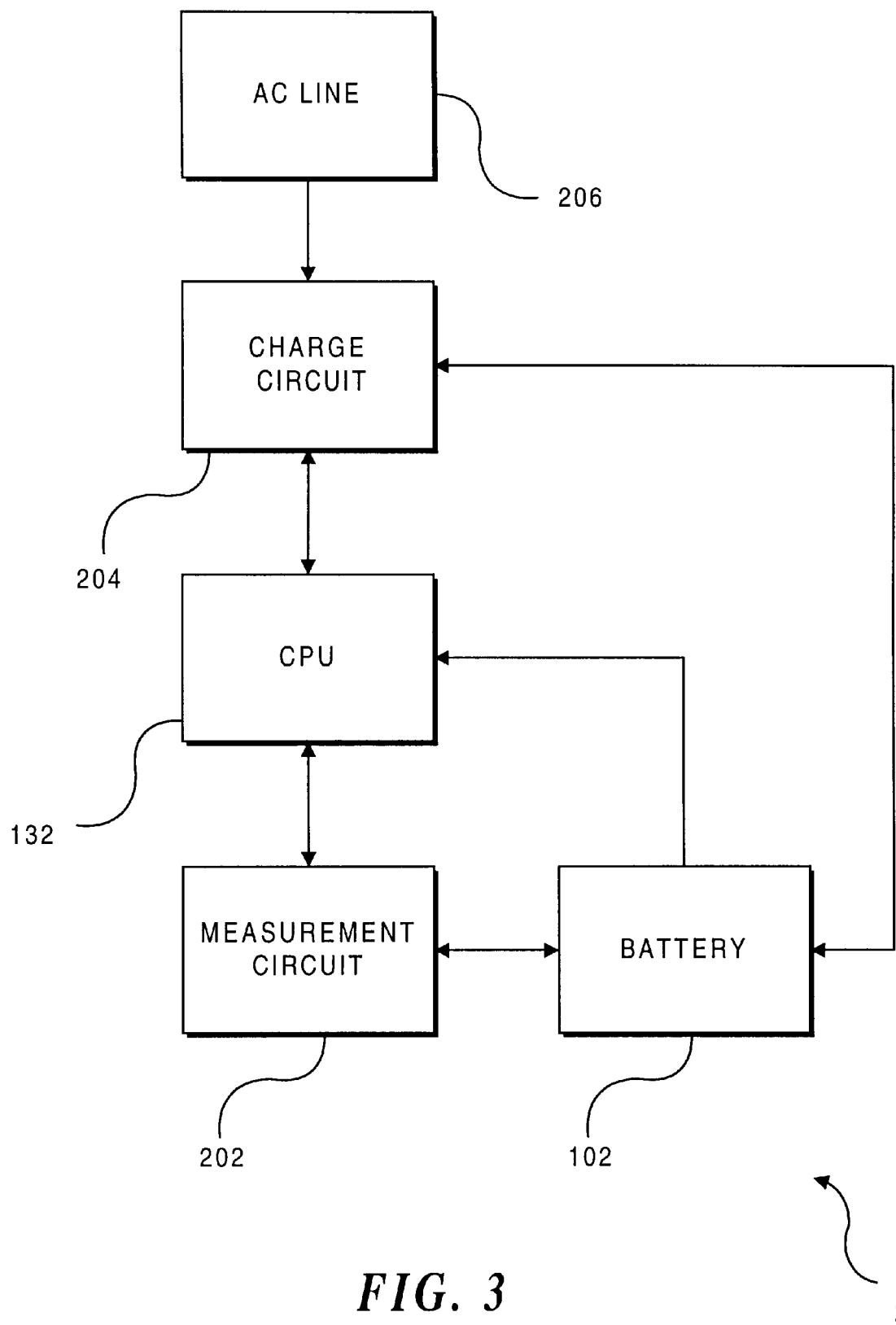
FIG. 3 is a functional block diagram showing an overview of the battery management system.

Turning now to FIG. 3, a functional block diagram identifies the major components of a battery management system 200 that embodies the present invention. An AC line source 206 supplies electrical power to a charge circuit 204 that is coupled to a battery 102. A measurement circuit 202 (i.e., all of the components of circuit 100 except CPU 132 and battery 102) is coupled to battery 102 to measure the current flowing from the battery over time and thus determine the charge remaining in the battery. If the charge (power) remaining stored in the battery is less than a predetermined limit, the user will be alerted, e.g., with a flashing alarm light or audible signal (neither shown), to recharge the battery. The charge and measurement circuits are coupled to CPU 132, which executes the software program to control and coordinate the various battery management circuits. Once the program determines that the battery has been sufficiently discharged, the charge circuit is automatically employed to replenish the charge stored within the battery, assuming the AC/DC supply is connected to the line power source.

In the preferred embodiment, battery 102 is a lead acid type. Other types of rechargeable and non-rechargeable batteries could alternatively be used, including nickel hydride, lithium ion, and nickel cadmium. In an alternative embodiment in which a non-rechargeable battery is employed, the program would not use charge circuit 204 to charge the battery. Instead, the program would only employ measurement circuit 202 to monitor the power (current) supplied by battery 102.

It is also envisioned that further alternative embodiments might employ a bipolar junction transistor (BJT) or a junction field effect transistor (JFET) to perform substantially the same function as MOSFET 106. Additionally, in an alternative embodiment, it might be desirable to connect a plurality of electronic switches in parallel with capacitor 122 across the input and output of opamp 120. Since the total resistance of the electronic switch is reduced by paralleling multiple switches, the RC time constant for resetting the output of opamp 120 to a low level waveform that represents a zero reference value would be significantly reduced compared to the 100 microseconds time period of the embodiment discussed above.

Although the present invention has been described in connection with the preferred form of practicing it and modifications thereto, those of ordinary skill in the art will understand that many other modifications can be made to the invention within the scope of the claims that follow. Accordingly, it is not intended that the scope of the invention in any way be limited by the above description, but instead be determined entirely by reference to the claims that follow.

The invention in which an exclusive right is claimed is defined by the following:

1. An electronic circuit for measuring a total electrical current that is discharged from a battery to energize a load, comprising:
   (a) a resistor having an end that is coupled in series with the load and the battery so that the electrical current supplied by the battery to energize the load flows through the resistor, a voltage developed across the resistor indicating a magnitude of the electrical current;
   (b) an integrator having an input that is coupled to the resistor to sense the voltage across the resistor, said integrator producing a signal at an output of the integrator that is indicative of a total electrical current supplied to energize the load over a time period and is thus indicative of a power consumed by the load over said time period, a switch being provided to reset the output of the integrator at an end of the time period, to enable the integrator to integrate the current supplied to energize the load for successive time periods;
   (c) an analog-to-digital converter coupled to the output of the integrator for receiving the signal, the analog-to-digital converter digitizing the signal to produce a corresponding digital value at an output of the analog-to-digital converter; and
   (d) a processor coupled to the output of the analog-to-digital converter, said processor producing the reset signal that is coupled to the integrator to reset it at the end of each time period and accumulating successive digital values produced by the analog-to-digital converter over successive time periods to determine the total current discharged by the battery to energize the load.

2. The electronic circuit of claim 1, wherein the time periods are periodic and the digital value is stored by the processor at the end of each time period to determine the total current discharged from the battery over the successive time periods.

3. The electronic circuit of claim 1, further comprising a plurality of resistors that are coupled to the input of the integrator, the resistors biasing the integrator so that the signal at the output of the integrator is not less than a defined level.

4. The electronic circuit of claim 3, wherein the signal at the output of the integrator is equal to or greater than zero volts when the battery is being charged by a line source supply, the supply providing electrical current to energize the electronic circuit and the load while the battery is being charged.

5. The electronic circuit of claim 4, further comprising a switch connected between the resistor and the battery, the switch being in a conductive state when the battery is supplying the electrical current to energize the load, but being periodically switched to a non-conductive state when the electronic circuit is being calibrated.

6. The electronic circuit of claim 5, wherein the switch is a voltage controlled solid-state device.

7. The electronic circuit of claim 1, further comprising a low pass filter that is coupled between the output of the integrator and the input of the analog-to-digital converter, the filter suppressing noise having a frequency higher than a frequency of the signal produced by the integrator.

8. The electronic circuit of claim 1, wherein the integrator includes a capacitor for storing charge, and wherein the switch that resets the output of the integrator is connected in parallel with the capacitor, closing of the switch discharging the capacitor to reset the output of the integrator for the successive time period.

9. The electronic circuit of claim 8, wherein the switch comprises a plurality of electronic switches coupled in parallel to reduce a resistance between the input and output of the integrator, and thereby reducing a time required to reset the signal at the output of the integrator.

10. The electronic circuit of claim 5, wherein the processor controls the switch in response to a signal indicative of whether the supply is being used to energize the electronic circuit.

11. The electronic circuit of claim 10, wherein the processor determines a zero current offset value when the switch is in the non-conductive state.

12. A method for measuring a total electrical current that is discharged from a battery to energize a load as a series of pulses, comprising the steps of:
   (a) sensing a voltage that is proportional to a magnitude of the electrical current supplied by the battery to energize the load;
   (b) integrating the voltage over a plurality of successive time periods, for each time period producing an analog signal indicative of a total electrical current supplied by the battery to energize the load over the time period;
   (c) converting the analog signal to a corresponding digital signal; and
   (d) summing the digital values produced for the plurality of successive time periods to determine the total electrical current discharged from the battery to energize the load.

13. The method of claim 12, wherein the plurality of successive time periods are periodic, and wherein a sum of the digital values is stored at an end of each time period to determine the total electrical current discharged from the battery to energize the load.

14. The method of claim 12, further comprising the step of biasing an integration of the voltage to at least a predetermined value when the electrical current is not being discharged from the battery.

15. The method of claim 14, wherein the predetermined value is equal to or greater than zero when the battery is being charged by a supply.

16. The method of claim 12, further comprising the step of filtering the analog signal with a low pass filter prior to the step of converting the analog signal to the corresponding digital signal.

17. The method of claim 12, further comprising the step of determining an offset correction when the battery is not supplying the electrical current to energize the load, said offset correction correcting for an induced electrical current.

18. The method of claim 17, wherein the offset correction is redetermined at predefined intervals.

19. A system for managing an electrical current discharged from a battery that energizes a load, comprising:
   (a) a battery;
   (b) a measurement circuit for determining a total current discharged by the battery over time;
   (c) a charging circuit that supplies current for recharging the battery;
   (d) a processor that executes a program to control the measurement circuit and the charging circuit to optimize usage of the battery, said measurement circuit determines a zero current offset value at time intervals when the battery is being recharged, said zero current offset value being used to offset an induced error in said measurement circuit.

20. The system of claim 19, wherein a user is alerted to use the charging circuit to recharge the battery if the total power discharged from the battery exceeds a predefined limit.

21. A system for managing an electrical current discharged from a battery that energizes a load, comprising:

(a) a battery;

(b) a measurement circuit for determining a total current discharged by the battery over time, said measurement circuit including an integrator for producing a signal at an output thereof that is indicative of the total electrical current supplied to energize the load over time and therefore indicative of the power consumed by the load over time;

(c) a charging circuit that supplies current for recharging the battery; and (d) a processor that executes a program to control the measurement circuit and the charging circuit to optimize usage of the battery.

* * * * *

UNITED STATES PATENT AND TRADEMARK OFFICE
CERTIFICATE OF CORRECTION

| | |
|---|---|
| PATENT NO. | : 5,994,876 |
| DATED | : November 30, 1999 |
| INVENTOR(S) | : David Canny et al. |

It is certified that error appears in the above-identified patent and that said Letters Patent is hereby corrected as shown below:

Column 2,
Line 35, replace "DRAWINGS" with --DRAWING FIGURES--.

Column 7,
Line 22, replace "develops" with --developed--.

Signed and Sealed this

Seventeenth Day of July, 2001

Attest:

*Nicholas P. Godici*

NICHOLAS P. GODICI
Attesting Officer — Acting Director of the United States Patent and Trademark Office